(12) United States Patent
Chang et al.

(10) Patent No.: US 9,324,786 B2
(45) Date of Patent: Apr. 26, 2016

(54) SEMICONDUCTOR DEVICE AND METHOD FOR FABRICATING THE SAME

(71) Applicant: Vanguard International Semiconductor Corporation, Hsinchu (TW)

(72) Inventors: Hsiung-Shih Chang, Taichung (TW); Jui-Chun Chang, Hsinchu (TW); Tsung-Hsiung Lee, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 6 days.

(21) Appl. No.: 14/250,938

(22) Filed: Apr. 11, 2014

(65) Prior Publication Data
US 2015/0295027 A1 Oct. 15, 2015

(51) Int. Cl.
H01L 21/8234 (2006.01)
H01L 29/06 (2006.01)
H01L 29/66 (2006.01)
H01L 29/78 (2006.01)
(Continued)

(52) U.S. Cl.
CPC ........ H01L 29/0634 (2013.01); H01L 29/0653 (2013.01); H01L 29/66659 (2013.01); H01L 29/66681 (2013.01); H01L 29/7823 (2013.01); H01L 29/7824 (2013.01); H01L 29/7833 (2013.01); H01L 29/7835 (2013.01); H01L 29/78624 (2013.01); H01L 21/26586 (2013.01)

(58) Field of Classification Search
CPC ............ H01L 29/0634; H01L 29/7835; H01L 29/66659; H01L 29/0696; H01L 29/4175; H01L 29/0692; H01L 29/0878; H01L 29/1083; H01L 29/7816; H01L 29/66681; H01L 29/7394; H01L 29/7824; H01L 29/0688; H01L 29/0886; H01L 29/1045; H01L 29/8086
USPC .......... 257/E29.027, E29.119, 335, 343, 347, 257/288, 336, 339, 341, 344, 408, E21.417, 257/E29.026, E29.054, E29.187, 120, 122, 257/141, 342, 401, 548, 611; 438/197, 286, 438/140
See application file for complete search history.

(56) References Cited

U.S. PATENT DOCUMENTS 6,777,746 B2 * 8/2004 Kitagawa ............ H01L 29/0634 257/335
7,550,804 B2 * 6/2009 Khemka ............. H01L 29/0634 257/341

(Continued)

*Primary Examiner* — Chuong A Luu
*Assistant Examiner* — Cory Eskridge
(74) *Attorney, Agent, or Firm* — Birch, Stewart, Kolasch & Birch, LLP

(57) ABSTRACT

A semiconductor device includes a semiconductor layer, a plurality of first doped regions, a gate structure, and second and third doped regions. The semiconductor layer has a first conductivity type. The first doped regions are in parallel disposed in a portion of the semiconductor layer along a first direction and have a second conductivity type and a rectangular top view. The gate structure is disposed over a portion of the semiconductor layer along a second direction, covering a portion of the first doped regions. The second doped region is disposed in the semiconductor layer along the second direction, being adjacent to a first side of the gate structure and having the second conductivity type. The third doped region is formed in the semiconductor layer along the second direction, being adjacent to a second side of the gate structure opposing the first side and having the second conductivity type.

20 Claims, 19 Drawing Sheets

(51) Int. Cl.
*H01L 29/786* (2006.01)
*H01L 21/265* (2006.01)

(56) References Cited

U.S. PATENT DOCUMENTS

2003/0190789 A1* 10/2003 Salama ............... H01L 29/0634
 438/286
2012/0292689 A1* 11/2012 Wu et al. ...................... 257/330

* cited by examiner

SEMICONDUCTOR DEVICE AND METHOD FOR FABRICATING THE SAME

BACKGROUND OF THE INVENTION

1. Field of the Invention

The present invention relates to integrated circuit (IC) devices, and particularly to a semiconductor device having a super-junction structure and a method for fabricating the same.

2. Description of the Related Art

Recently, as demand increases for high-voltage devices, such as power semiconductor devices, there has been an increasing interest in research for high-voltage metal-oxide-semiconductor field effect transistors (HV MOSFET) applied in high-voltage devices.

Among the various types of high voltage metal-oxide-semiconductor field effect transistors, a super-junction structure is often used for reducing the on-resistance (Ron) and maintaining high breakdown voltage.

However, with the ongoing trend of size reduction in semiconductor fabrication, the critical size of high-voltage MOSFETs in power semiconductor devices needs to be reduced further. Thus, a reliable high voltage MOSFET in the power semiconductor device having a reduced size is needed to meet device performance requirements such as driving currents, on-resistances, and breakdown voltages, as the needs and trends in size reduction of power semiconductor devices continue.

BRIEF SUMMARY OF THE INVENTION

An exemplary semiconductor device comprises a semiconductor layer, a plurality of first doped regions, a gate structure, a second doped region, and a third doped region. The semiconductor layer has a first conductivity type. The first doped regions are separately and in parallel disposed in a portion of the semiconductor layer along a first direction and have a second conductivity type opposite to the first conductivity type and a rectangular top view. The gate structure is disposed over a portion of the semiconductor layer along a second direction, wherein the gate structure covers a portion of the first doped regions. The second doped region is disposed in the semiconductor layer along the second direction and is adjacent to a first side of the gate structure, wherein the second doped region has the second conductivity type. The third doped region is formed in the semiconductor layer along the second direction and is adjacent to a second side of the gate structure opposing the first side, wherein the third doped region has the second conductivity type.

An exemplary method for fabricating a semiconductor device comprises the following steps: (a) providing a semiconductor layer, having a first conductivity type; (b) forming an opening in a plurality of parallel and separated portions of the semiconductor layer; (c) forming a first doped region in a portion of the semiconductor layer adjacent to a side of the opening; (d) forming an insulating layer or a doped material layer in the opening, wherein the doped material layer has a second conductivity type opposite to the first conductivity type; (e) forming a gate structure over a portion of the semiconductor layer, wherein the gate structure extends over the semiconductor layer along a second direction perpendicular to the first direction; and (f) forming a second doped region in a portion of the semiconductor layer at a first side of the gate structure, and a third doped region in a portion of the semiconductor layer at a second side opposite to the first side of the gate structure, wherein the second doped region and the third doped region have the second conductivity type.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
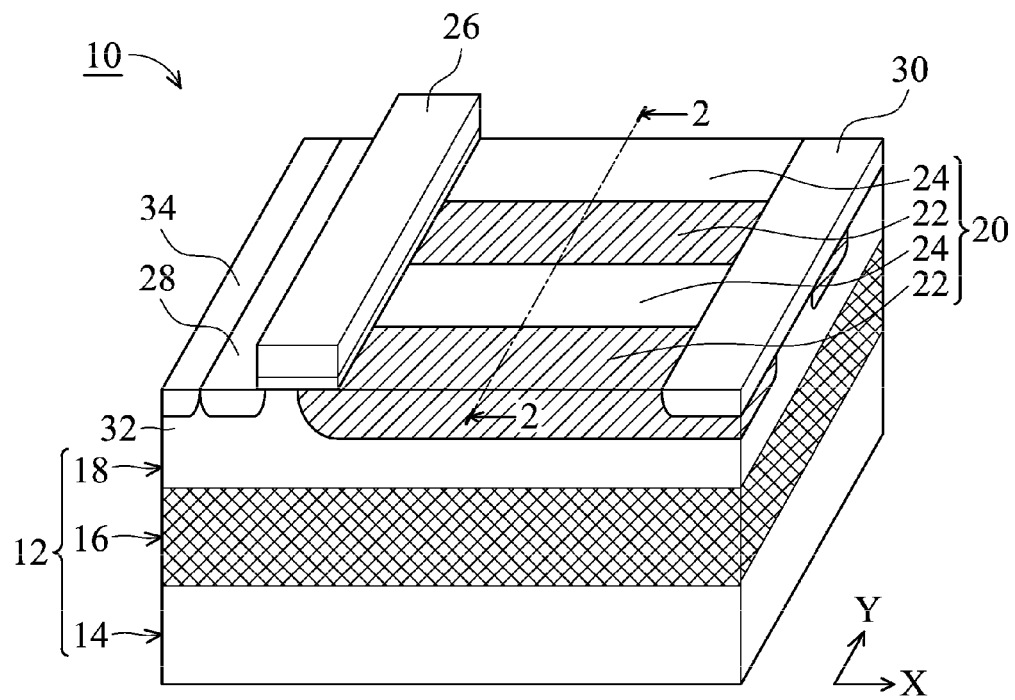
FIG. 1 is a schematic perspective view of a semiconductor device according to an embodiment of the invention.

FIG. 1 is a schematic perspective view showing an exemplary semiconductor device 10 having a lateral super-junction structure.

Herein, the semiconductor device 10 is a comparative embodiment and is illustrated as a metal-oxide-semiconductor field effect transistor (MOSFET) configuration to discuss issues such as the driving-current reduction that takes place as the size of the semiconductor device 10 is reduced. However, the scope of the semiconductor device of the invention is not limited by the illustrated semiconductor device 10 and may have other configurations.

As shown in FIG. 1, the semiconductor device 10 comprises a semiconductor-on-insulator (SOI) substrate 12, and the SOI substrate 12 comprises a bulk semiconductor layer 14, and a buried insulating layer 16 and a semiconductor layer 18 sequentially formed over the bulk semiconductor layer 14. The bulk semiconductor layer 14 and the semiconductor layer 18 may comprise semiconductor materials such as silicon. The buried insulating layer 16 may comprise insulating materials such as silicon dioxide. The semiconductor layer 18 may comprise dopants of a first conductivity type, such as P-type. In the semiconductor device 10, a super junction structure 20 is formed in a portion of the semiconductor layer 18, comprising a plurality of adjacent doped regions 22 and 24 which are laterally and alternately disposed. The doped regions 24 are a portion of the semiconductor layer 18 that have the same conductive type of the semiconductor layer 18. The doped regions 22 are doped regions comprising dopants of a second conductivity type opposite to the first conductivity type, such as N-type, and can be formed in various portions of the semiconductor layer 18 by, for example, an ion implantation process. The doped regions 22 may function as a drift region of the semiconductor device 10. In addition, a gate structure 26 is formed over a portion of the semiconductor layer 18, and two adjacent doped regions 28 and 34, and a doped region 30 are formed in a portion of the semiconductor layer 18 at opposite sides of the gate structure 26. The doped region 34 is a doped region having the first conductivity type of the semiconductor layer 18, and the doped regions 28 and 30 are doped regions having the second conductivity type opposite to the first conductivity type of the semiconductor layer 18 for functioning as source and drain regions, respectively. The gate structure 26 extends over a portion of the semiconductor layer 18 along the Y direction in FIG. 1 and partially covers the doped regions 22 and 24 of the super-junction structure 20. The doped region 30 is disposed in a portion of the doped regions 22 and 24 and is surrounded by the doped regions 22 and 24. The doped regions 28 and 34 are disposed in a well region 32 and are surrounded by the well region 32. The well region 32 is a portion of the semiconductor layer 18 adjacent to the doped regions 28 and 34 and is partially covered by the gate structure 26. The well region 32 comprises dopants of the first conductivity type of the semiconductor layer 18, and a bottom portion thereof contacts the top portion of the buried insulating layer 16. The doped regions 28 and 34 in the well region 32 are surrounded by the well region 32.

Figure 2:
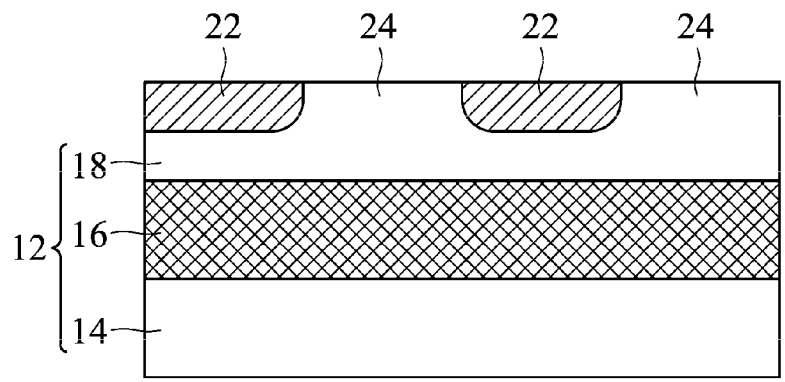
FIG. 2 is a schematic cross-sectional view showing a cross section along the line 2-2 in FIG. 1.

In FIG. 2, a schematic cross-sectional view along the line 2-2 in FIG. 1 is illustrated. As shown in FIG. 2, due to the use of the super-junction structure 20 formed by the doped regions 22 and 24 which are alternately disposed, the semiconductor device 10 is thus suitable for high-voltage operation applications such as power semiconductor devices.

However, the doped regions 22 are formed by performing ion implantation and diffusion processes to various portions of the semiconductor layer 18. Thus, as the size of the semiconductor device 10 is reduced, the device size such as the surface area of the semiconductor device 10 will also be reduced, such that the area for forming the doped regions 22 will be also reduced. Due to driving currents of the semiconductor device 10 being in proportion to the sum of the cross-sectional area of the doped regions 22 in the semiconductor layer 18, reduction of the area for forming the doped regions 22 may also reduce the driving currents and increase the on-resistance of the semiconductor device 10. Thus, the surface area of the doped regions 22 needs to be increased to maintain or improve the driving currents of the semiconductor device 10, which is variant of the size reduction of the semiconductor device 10.

Thus, an improved semiconductor device having a super-junction structure and a method for fabricating the same are provided to maintain or improve driving currents of the semiconductor device, and maintain or reduce the on-resistance of the semiconductor device as the size thereof is further reduced.

Figure 9:
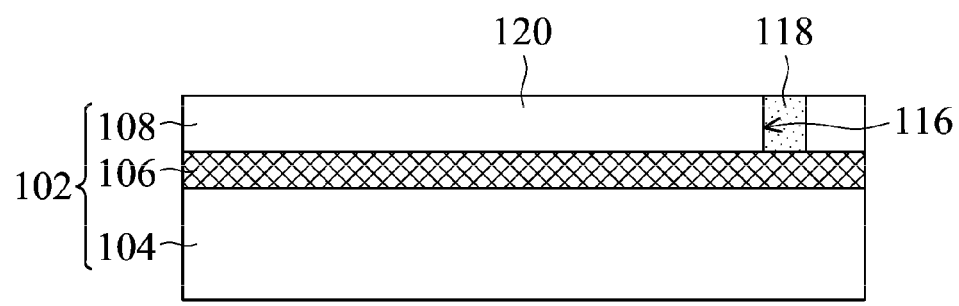
FIG. 9 is a schematic cross-sectional view showing a cross section along the line 9-9 in FIG. 8.
Figure 10:
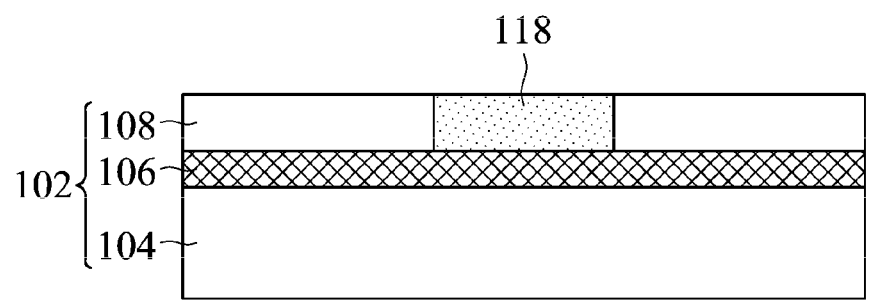
FIG. 10 is a schematic cross-sectional view showing a cross section along the line 10-10 in FIG. 8.
Figure 11:
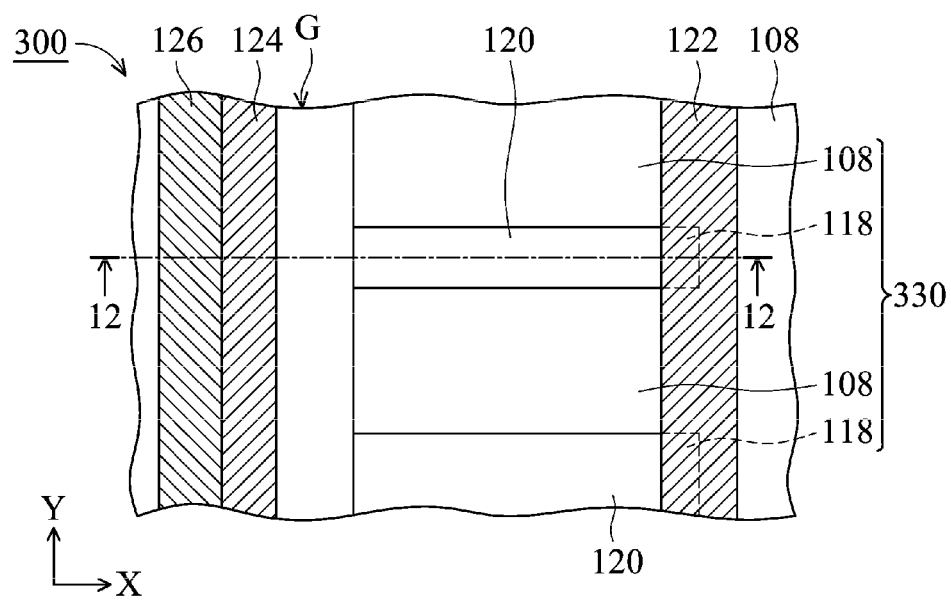
Figure 12:
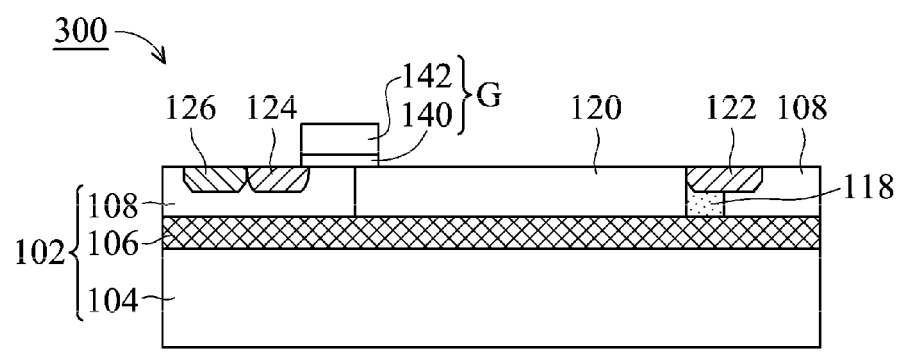
FIG. 12 is a schematic cross-sectional view showing a cross section along the line 12-12 in FIG. 11.
Figure 13:
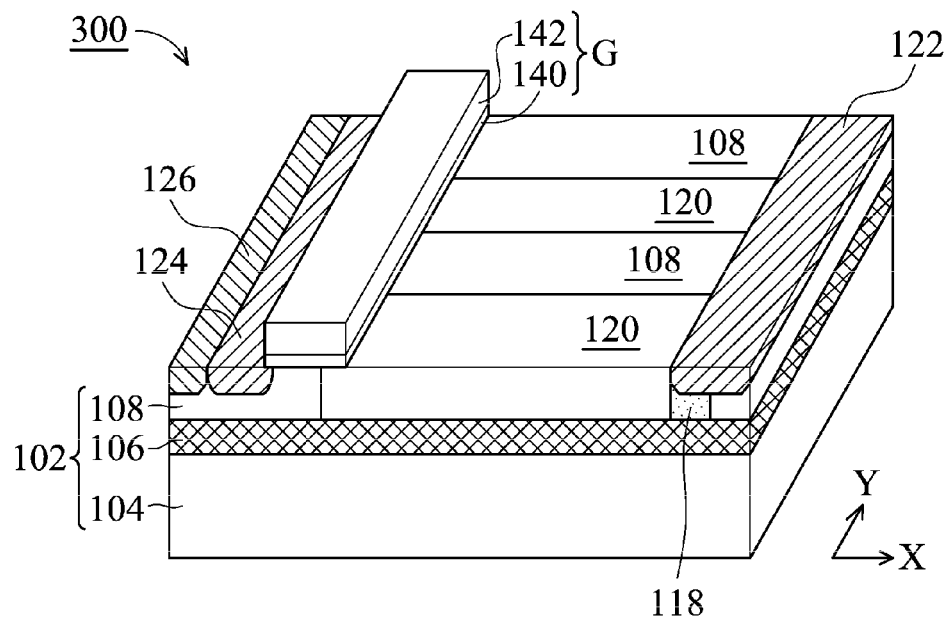
FIG. 13 is a schematic perspective view of the semiconductor device shown in FIGS. 11-12.

FIGS. 3-13 are schematic diagrams showing an exemplary method for fabricating a semiconductor device, wherein FIGS. 3, 5, 8, and 11 are schematic top views, and FIGS. 4, 6-7, 9-10, and 12 are schematic cross-sectional views along predetermined lines in FIGS. 3, 5, 8, and 11, respectively, and FIG. 13 is a schematic perspective view showing the semiconductor device in FIGS. 11-12, thereby showing fabrications in intermediate steps in the method for fabricating the semiconductor device.

Figure 3:
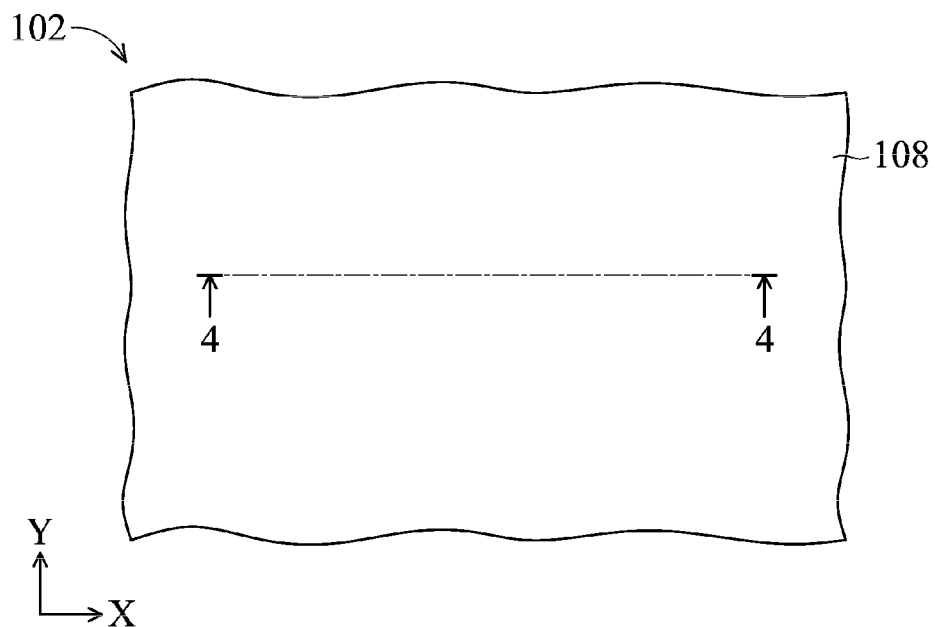
FIGS. 3, 5, 8, and 11 are schematic top views showing a method for fabricating a semiconductor device according to an embodiment of the invention.
Figure 4:
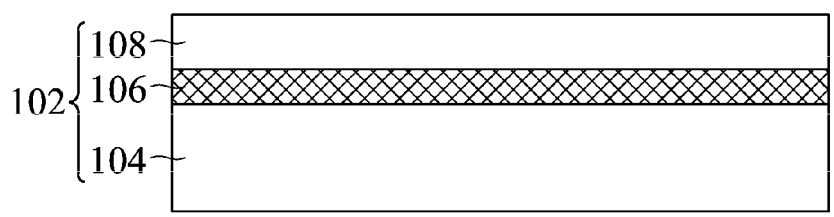
FIG. 4 is a schematic cross-sectional view showing a cross section along the line 4-4 in FIG. 3.

In FIGS. 3-4, a semiconductor substrate 102 is provided first. FIG. 3 shows a schematic top view of the semiconductor substrate 102, and FIG. 4 is a schematic cross sectional view along the line 4-4 in FIG. 3.

As shown in FIG. 4, the semiconductor substrate 102 is, for example, a semiconductor-on-insulator (SOI) substrate. The semiconductor substrate 102 comprises a bulk semiconductor layer 104, and a buried insulating layer 106 and a semiconductor layer 108 sequentially over the bulk semiconductor layer 104. The bulk semiconductor layer 104 and the semiconductor layer 108 may comprise semiconductor materials such as silicon. The buried insulating layer 106 may comprise insulating materials such as silicon dioxide. The semiconductor layer 108 may comprise dopants of a first conductivity type such as P-type or N-type.

Figure 5:
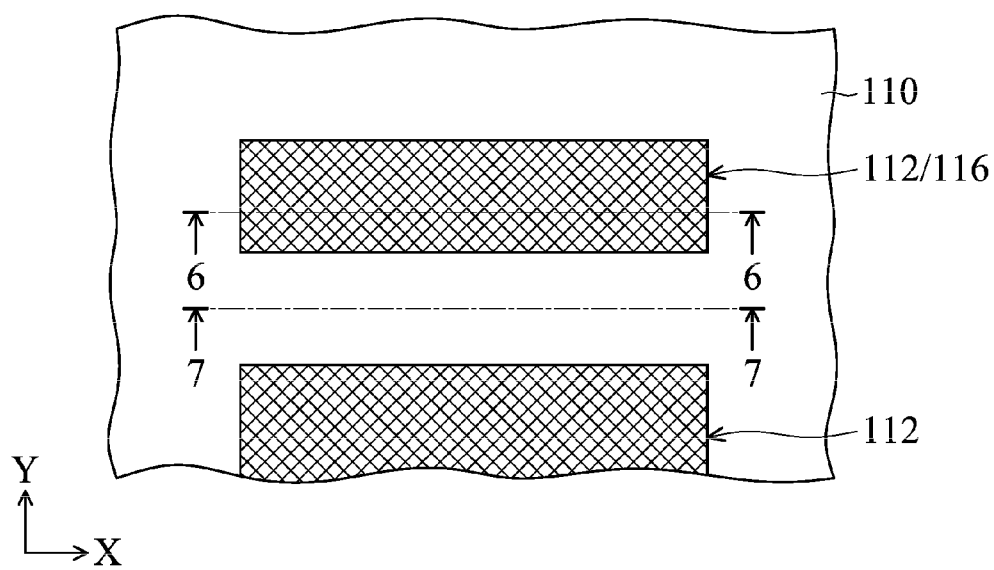
Figure 6:
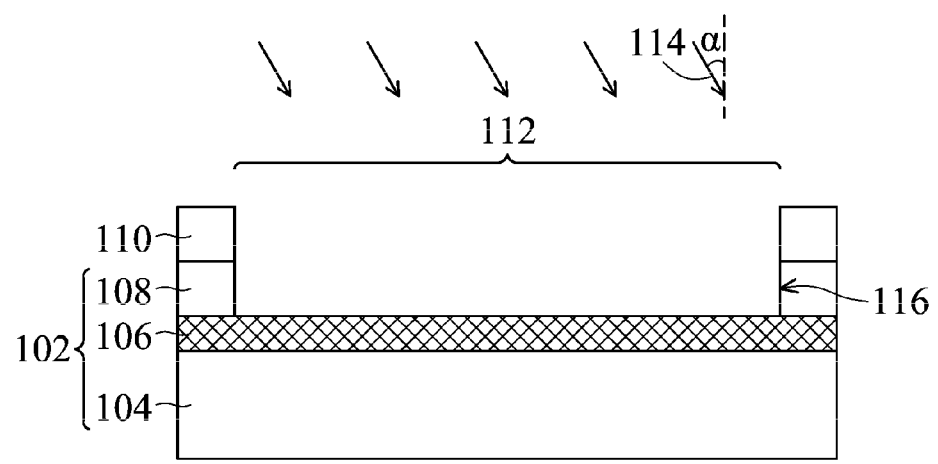
FIG. 6 is a schematic cross-sectional view showing a cross section along the line 6-6 in FIG. 5.
Figure 7:
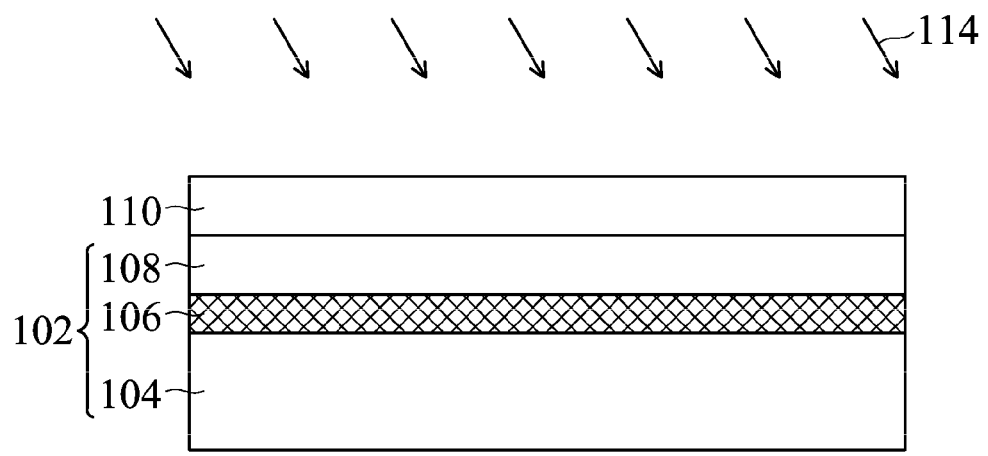
FIG. 7 is a schematic cross-sectional view showing a cross section along the line 7-7 in FIG. 5.

As shown in FIGS. 5-7, a plurality of parallel and separated openings 112/116 are next formed in the semiconductor layer 108. These openings 112/116 respectively expose a portion of the buried insulating layer 106. FIG. 5 shows a schematic top view of the semiconductor substrate 102 having the openings 112/116, and FIGS. 6-7 are schematic cross-sectional views along the lines 6-6 and 7-7 in FIG. 5, respectively.

As shown in FIG. 5-6, a patterned mask layer 110 is formed over the semiconductor layer 108, and the patterned mask layer 110 is formed with a plurality of parallel and separated openings 112 therein. The openings 112 extend along the X direction in FIG. 5 and respectively expose a portion of the semiconductor layer 108. The patterned mask layer 110 may comprise materials such as photoresist, such that the openings 112 can be formed in the patterned mask layer 110 by processes such as photolithography and etching (not shown) incorporating with a suitable photomask (not shown). Next, an etching process (not shown) is performed to remove the portion of the semiconductor layer 108 exposed by each of the openings 112, using the patterned mask layer 110 as an etching mask, thereby transferring the pattern of the openings 112 into the semiconductor layer 108 and forming a plurality openings 116 having a pattern the same as that of the openings 112. Each of the openings 116 exposes a portion of the underlying buried insulating layer 106.

Next, an ion implantation process 114 is performed, using the patterned mask layer 110 as an implant mask, to implant dopants (not shown) having a second conductivity type opposite to the first conductivity type of the semiconductor layer 108 into a portion of the semiconductor layer 108 covered by the patterned mask layer 110 adjacent to a side (e.g a right side or a left side, but shown here as the right side in FIG. 6) of each of the openings 106 along the X direction. In one embodiment, the ion implantation process 114 can be, for example, a tilt-angle implantation process using an incident angle α and an implant energy (not shown). The incident angle and the implant energy used in the ion implantation process 114 can be adjusted according to the thickness of the semiconductor layer 108 to thereby implant dopants with a desired concentration into the semiconductor layer 108. In addition, as shown in FIG. 7, a portion of the semiconductor layer 108 between the adjacent openings 116 is protected by the patterned mask layer 110 and is not implanted by the dopants having the second conductivity type in the ion implantation process 114, thereby still having the first conductivity type.

Figure 8:
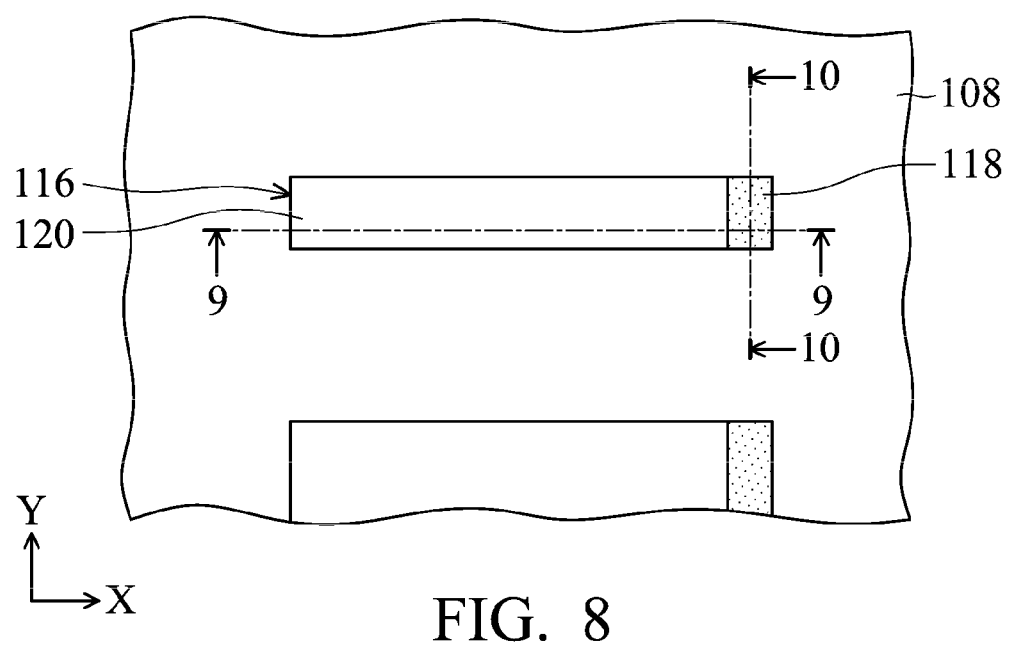

Referring to FIGS. 8-10, a doped region 118 is next formed in a portion of the semiconductor layer 108 adjacent to each of the openings 116 (illustrated as a portion at the right side of each of the openings 116), and an insulating layer 120 is then formed in each of the openings 116. FIG. 8 is a schematic top view showing the semiconductor layer 108 having a plurality of doped region 118 and the insulating layers 120 therein, and FIGS. 9-10 are schematic cross-sectional views along lines 9-9 and 10-10 in FIG. 8, respectively.

As shown in FIGS. 8-9, after removal of the patterned mask layer 110 formed over the semiconductor layer 108 shown in FIGS. 5-7, a thermal diffusion process (not shown) such as an annealing process is then performed to diffuse the dopants previously implanted in the portion of the semiconductor layer 108 covered by the patterned mask layer 110 and being adjacent to a side (e.g. the right side) of each of the openings 106 along the X direction in FIG. 5 into a doped region 118, and the doped region 118 has the second conductivity type opposite to the first conductivity type of the semiconductor layer 108. As shown in FIG. 8, the doped region 118 is substantially formed in a portion of the semiconductor layer 108 adjacent to a side (e.g. the right side) of each of the openings 116 and has a substantially rectangular configuration from a top view. Next, an insulating material (not shown) such as oxide or nitride is formed over the semiconductor layer 108 by a process such as deposition or spin-coating (not shown) and fills the openings 116. A planarization process (not shown) such as a chemical mechanical polishing (CMP) process or an etching back process is performed next to remove the insulating material over the surface of the semiconductor layer 108, thereby forming an insulating layer 120 in each of the openings 116. In one embodiment, a top surface of the insulating layer 120 and a top surface of the semiconductor layer 108 are substantially coplanar. Moreover, as shown in FIG. 10, a cross-sectional view of the doped region 118 disposed in a portion of the semiconductor layer 108 adjacent to a side (e.g. the right side) of the opening 106 is illustrated.

Referring to FIGS. 11-13, a gate structure G is next formed over the semiconductor layer 108, and doped regions 124 and 126 are formed in a portion of the semiconductor layer 108 at a side of the gate structure G, and a doped region 122 is formed in a portion of the semiconductor layer 108 at another side of the gate structure G. FIG. 11 is a schematic top view, and FIGS. 12-13 are schematic cross-sectional views along lines 12-12 and 13-13 in FIG. 11, respectively.

As shown in FIG. 11, the gate structure G and the doped regions 122, 124, and 126 are formed over or in the semiconductor layer 108 along the Y direction perpendicular to the X direction in FIG. 11. The gate structure G partially covers the semiconductor layer 108, and the doped regions 124 and 126 are formed in a portion of the semiconductor layer 108 at a side adjacent to the gate structure G. The doped region 122 is formed in a portion of the semiconductor layer 108 at another side of the gate structure G, and is also disposed over a portion of the doped region 118, as shown in FIG. 12. In addition, as shown in FIG. 12, the gate structure G comprises a gate dielectric layer 140 and a gate electrode layer 142 sequentially formed over the semiconductor layer 108.

Herein, fabrication of the gate dielectric layer 140 and the gate electrode layer 142 of the gate structure G and the doped regions 122, 124, and 126 shown in FIGS. 11-12 can be formed by conventional high-voltage MOS processes, and the gate dielectric layer 140 and the gate electrode layer 142 may comprise materials used in conventional HV MOSFETs, such that materials and fabrications thereof are not described here, and the doped regions 122 and 124 comprising dopants having the second conductivity type opposite to the first conductivity type of the semiconductor layer 108 may function as source/drain regions, and the doped region 126 may comprise dopants of the first conductivity type of the semiconductor layer 108. The portion of the semiconductor layer 108 covering the doped regions 124 and 126 may function as a well region of the first conductivity type. FIG. 13 is a schematic perspective view of the semiconductor device shown in FIGS. 11-12.

Therefore, fabrication of a semiconductor device 300 is substantially completed, and the semiconductor device 300 is a MOS transistor comprising a super-junction structure 330. The super junction structure 330 is composed of a plurality of separated doped regions 118 having a substantially rectangular configuration and a portion of the semiconductor layer 108 adjacent thereto. The doped regions 118 having the second conductivity type may function as a drift-region of the semiconductor device 300, such that the semiconductor device 300 can sustain a high breakdown voltage.

In one embodiment, as the semiconductor layer 108 of the semiconductor device 300 shown in FIGS. 11-13 has the first conductivity type such as P-type, and dopants in the doped regions having the second conductivity type are N-type dopants, the semiconductor device 300 formed is a PMOS transistor. Alternatively, in another embodiment, as the semiconductor layer 108 of the semiconductor device 300 shown in FIGS. 11-13 have the first conductivity type such as N-type, and dopants in the doped regions having the second conductivity type are P-type dopants, the formed semiconductor device 300 is a NMOS transistor.

When compared with the semiconductor device 10 shown in FIGS. 1-2, thicknesses of the semiconductor layer 108 and the doped regions 118 formed therein can be further increased or reduced in the semiconductor device 300 shown in FIGS. 11-13 depending on designs such as driving currents, on-resistances and breakdown voltages. Therefore, due to the formation of the semiconductor layer 108 and the doped regions 118 therein, without increasing the surface area of the separated doped regions 118 in the super junction structure 330 of the semiconductor device 300, thicknesses of the semiconductor layer 108 and the doping regions 118 are increased to increase the sum of the cross section of the doped regions 118 in the semiconductor layer 108, thereby increasing driving currents and reducing on-resistance of the semiconductor device 300. In addition, a deep trench isolation (not shown) may be formed in the semiconductor layer (e.g. the semiconductor layer 108) of the semiconductor device 300 to surround the same. The deep trench isolation penetrates a portion of the semiconductor layer 108, and is made of insulating materials such as silicon dioxide that contacts the buried insulating layer 106. Due to the formation of the deep trench isolation, noises affecting the semiconductor device 300 can be reduced and a latch-up effect in the semiconductor device 300 is thus prevented.

Figure 14:
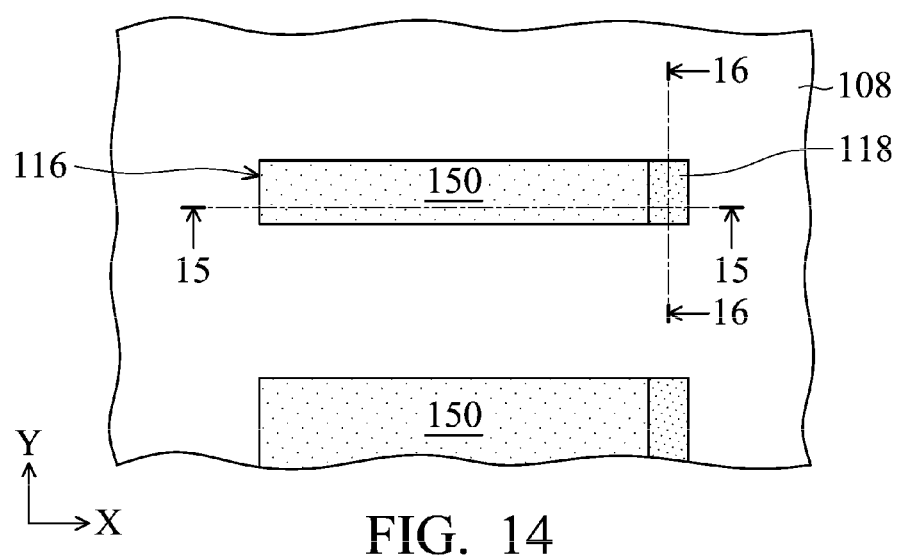
FIGS. 14 and 17 are schematic top views showing a method for fabricating a semiconductor device according to another embodiment of the invention.
Figure 15:
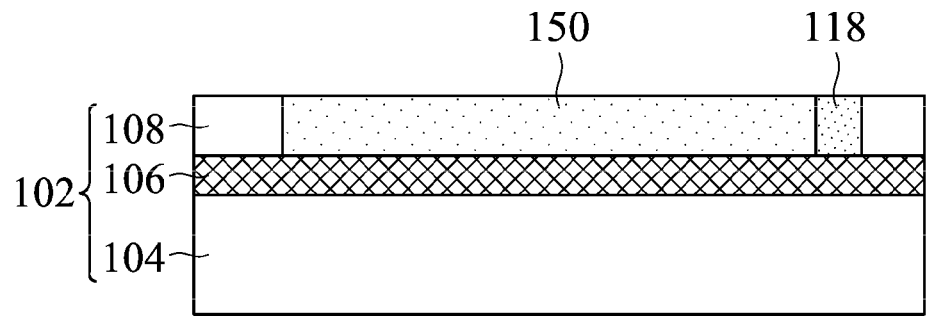
FIG. 15 is a schematic cross-sectional view showing a cross section along the line 15-15 in FIG. 14.
Figure 16:
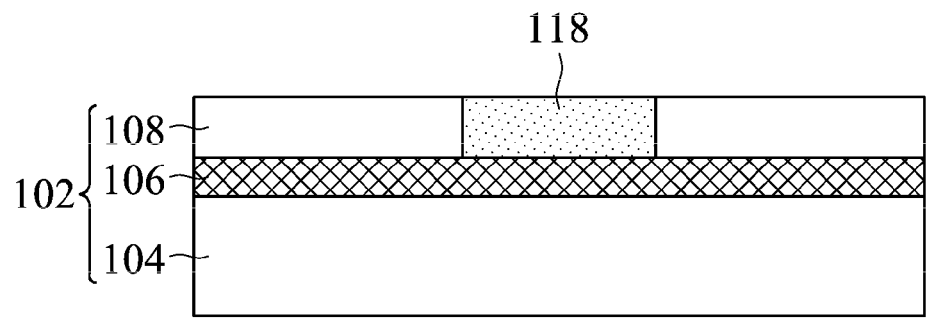
FIG. 16 is a schematic cross-sectional view showing a cross section along the line 16-16 in FIG. 14.
Figure 17:
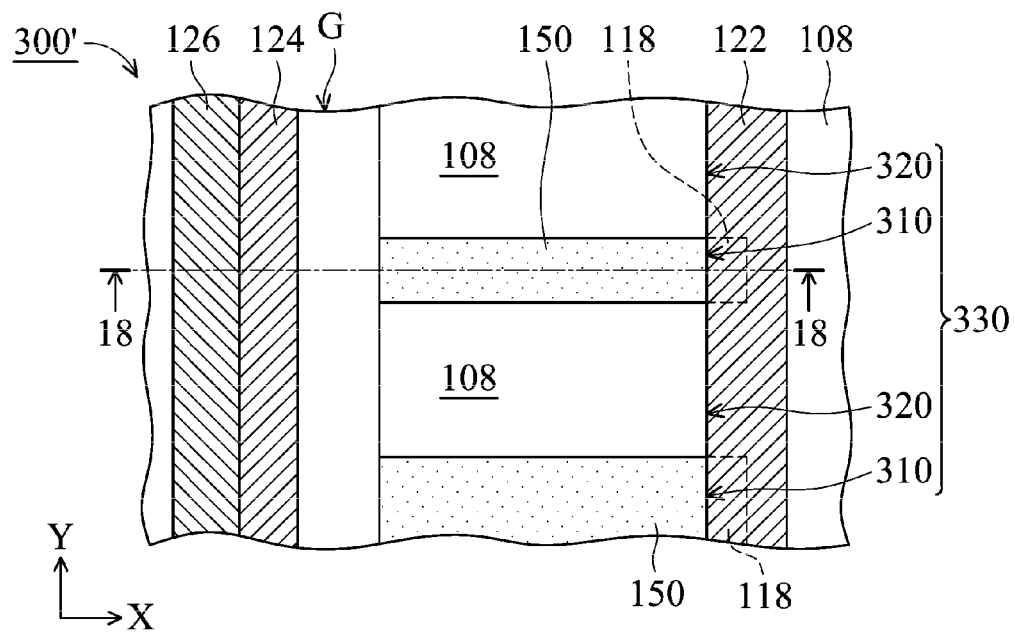
Figure 18:
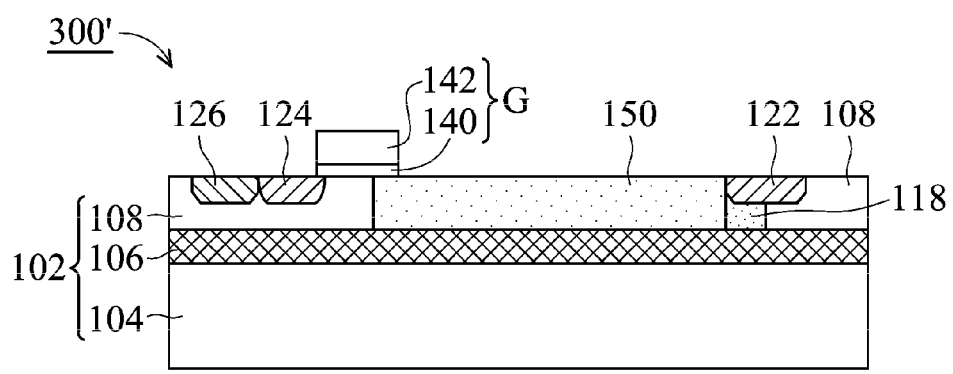
FIG. 18 is a schematic cross-sectional view showing a cross section along the line 18-18 in FIG. 17.
Figure 19:
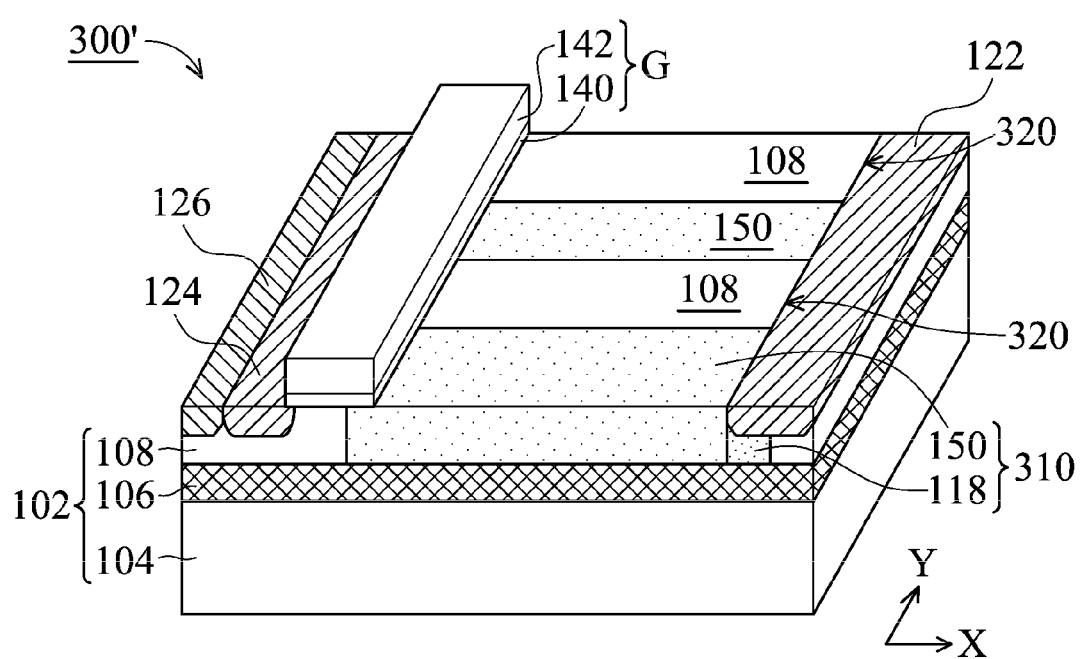
FIG. 19 is a schematic perspective view of the semiconductor device shown in FIGS. 17-18.

FIGS. 14-19 are schematic diagrams showing another exemplary method for fabricating a semiconductor device, wherein FIGS. 14 and 17 are schematic top views, and FIGS. 15-16 and 18 are schematic cross sectional views along predetermined lines in FIGS. 14 and 17, respectively, and FIG. 19 is a schematic perspective view of the structure shown in FIGS. 17-18, thereby showing fabrications in intermediate steps in the method for fabricating the semiconductor device. Herein, the exemplary method shown in FIGS. 14-19 is modified from the exemplary method shown in FIGS. 3-13. For the purpose of simplicity, the same numeral references represent the same components, and only differences between these two exemplary methods are described in the following.

According to fabrications shown in FIGS. 3-7 and descriptions related thereto, the structures shown in FIGS. 5-7 (not shown here) are first provided. Referring to FIGS. 14-16, a doped region 118 is next formed in a portion of the semiconductor layer 108 adjacent to each of the openings 116 (illustrated as a portion at the right side of each of the openings 116), and a doped material layer 150 is formed in each of the openings 116. FIG. 14 is a schematic top view showing the semiconductor layer 108 having a plurality of doped regions 118 and the doped material layers 150 therein, and FIGS. 15-16 are schematic cross-sectional views along lines 15-15 and 16-16 in FIG. 14, respectively.

As shown in FIGS. 14-15, after removal of the patterned mask layer 110 formed over the semiconductor layer 108 shown in FIGS. 5-7, a thermal diffusion process (not shown) such as an annealing process is then performed to diffuse the dopants previously implanted in the portion of the semiconductor layer 108 covered by the patterned mask layer 110 and being adjacent to a side (e.g. the right side) of each of the openings 106 along the X direction in FIG. 5 into a doped region 118, and the doped region 118 has the second conductivity type opposite to the first conductivity type of the semiconductor layer 108. As shown in FIG. 14, the doped region 118 is substantially formed in a portion of the semiconductor layer 108 adjacent to a side (e.g. the right side) of each of the openings 116 and has a substantially rectangular configuration from the top view. Next, a doped material (not shown) such as doped polysilicon and doped silicon doped with dopants of a second conductivity type is formed over the semiconductor layer 108 by a process such as deposition or epitaxial growth (not shown) and fills the openings 116. A planarization process (not shown) such as a chemical mechanical polishing (CMP) process or an etching back process is next performed to remove the doped material over the surface of the semiconductor layer 108, thereby forming a doped material layer 150 in each of the openings 116. In one embodiment, a top surface of the doped material layer 150 and a top surface of the semiconductor layer 108 are substantially coplanar, and the doped material layer 150 can be in-situ doped with the dopants having the second conductivity type during the formation thereof. Moreover, as shown in FIG. 16, a cross-sectional view of the doped region 118 disposed in a portion of the semiconductor layer 108 adjacent to a side (e.g. the right side) of the opening 106 is illustrated.

Referring to FIGS. 17-19, a gate structure G is next formed over the semiconductor layer 108, and doped regions 124 and 126 are formed in a portion of the semiconductor layer 108 at a side of the gate structure G, and a doped region 122 is formed in a portion of the semiconductor layer 108 at another side of the gate structure G. FIG. 17 is a schematic top view, and FIG. 18 is a schematic cross-sectional view along line 18-18 and in FIG. 19, and FIG. 19 is a schematic perspective diagram showing the structure shown in FIGS. 17-18.

As shown in FIG. 17, the gate structure G and the doped regions 122, 124, and 126 are formed over or in the semiconductor layer 108 along the Y direction perpendicular to the X direction in FIG. 11. The gate structure G partially covers the semiconductor layer 108, and the doped regions 124 and 126 are formed in a portion of the semiconductor layer 108 at a side (e.g. the left side) adjacent to the gate structure G. The doped region 122 is formed in a portion of the semiconductor layer 108 at another side (e.g. the right side) of the gate structure G, and is also disposed over a portion of the doped region 118, as shown in FIG. 18. In addition, as shown in FIG. 18, the gate structure G comprises a gate dielectric layer 140 and a gate electrode layer 142 sequentially formed over the semiconductor layer 108.

Herein, fabrication of the gate dielectric layer 140 and the gate electrode layer 142 of the gate structure G and the doped regions 122, 124, and 126 shown in FIGS. 17-18 can be formed by conventional high-voltage MOS processes, and the gate dielectric layer 140 and the gate electrode layer 142 may comprise materials used in conventional HV MOSFETs, such that materials and fabrications thereof are not described here, and the doped regions 122 and 124 comprising dopants having the second conductivity type opposite to the first conductivity type of the semiconductor layer 108 may function as source/drain regions, and the doped region 126 may comprise dopants of the first conductivity type of the semiconductor layer 108. The portion of the semiconductor layer 108 covering the doped regions 124 and 126 may function as a well region of the first conductivity type. FIG. 19 is a schematic perspective view of the semiconductor device shown in FIGS. 17-18.

Therefore, fabrication of another exemplary semiconductor device 300' is substantially completed, and the semiconductor device 300' is a MOS transistor comprising a super-junction structure 330. The super-junction structure 330 is composed of a plurality of separated composite doped regions 310 composed of the doped regions 118 having a substantially rectangular configuration and the doped material layers 150 adjacent thereto, and a plurality of separated doped regions 320 composed of a portion of the semiconductor layer 108 adjacent to the composite doped regions 310. The composite doped regions 310 having the second conductivity type composed of the doped regions 118 with substantially rectangular configurations and the doped material layers 150 adjacent thereto may function as a drift-region of the semiconductor device 300', such that the semiconductor device 300' can sustain a high breakdown voltage.

In one embodiment, as the semiconductor layer 108 of the semiconductor device 300' shown in FIGS. 17-19 has the first conductivity type such as P-type, and dopants in the doped regions having the second conductivity type are N-type dopants, the semiconductor device 300' formed is a PMOS transistor. Alternatively, in another embodiment, as the semiconductor layer 108 of the semiconductor device 300' shown in FIGS. 17-19 have the first conductivity type such as N-type, and dopants in the doped regions having the second conductivity type are P-type dopants, the formed semiconductor device 300' is a NMOS transistor.

When compared with the semiconductor device 10 shown in FIGS. 1-2, thicknesses of the semiconductor layer 108 and the composited doped regions 310 formed therein can be further increased or reduced in the semiconductor device 300' shown in FIGS. 17-19 depending on designs such as driving currents, on-resistances and breakdown voltages. Therefore, due to the formation of the semiconductor layer 108 and the composite doped regions 310 therein, without increasing the surface area of the separated composite doped regions 310 in the super-junction structures 330 of the semiconductor device 300', thicknesses of the semiconductor layer 108, and the doped regions 118 and doped material layers 150 formed in the semiconductor layer 108 are increased to increase the sum of the cross section of the composite doped regions 310 in the semiconductor layer 108, thereby increasing driving currents and reducing on-resistance of the semiconductor device 300'. In addition, a deep trench isolation (not shown) may be formed in the semiconductor layer (e.g. the semiconductor layer 108) of the semiconductor device 300 to surround the same. The deep trench isolation penetrates a portion of the semiconductor layer 108, and is made of insulating materials such as silicon dioxide that contacts the buried insulating layer 106. Due to the formation of the deep trench isolation, noises affecting the semiconductor device 300' can be reduced and a latch-up effect in the semiconductor device 300' is thus prevented.

Figure 20:
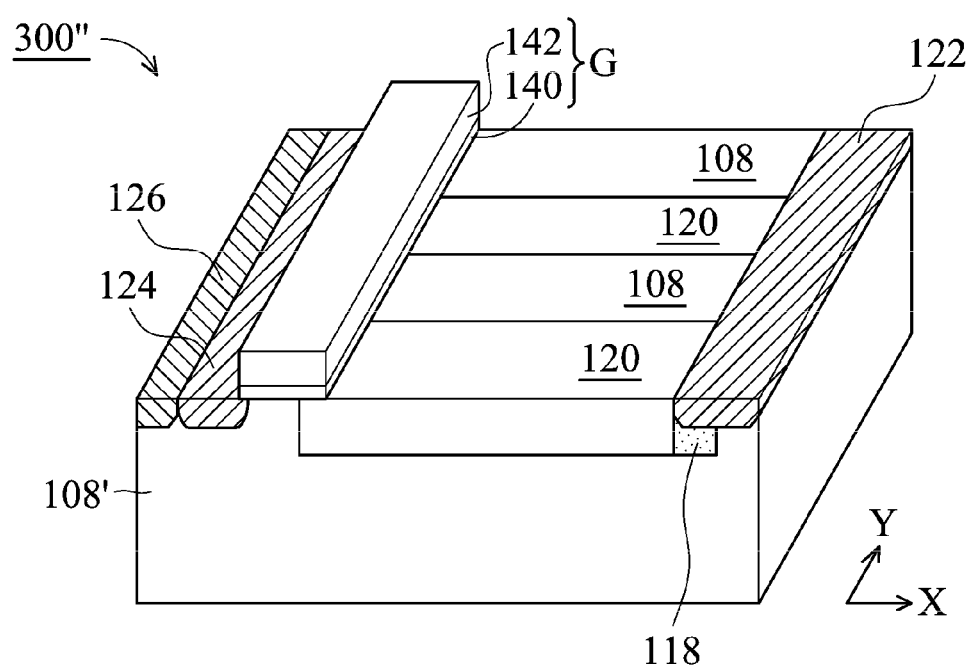
FIG. 20 is a schematic perspective view of the semiconductor device according to an embodiment of the invention.
Figure 21:
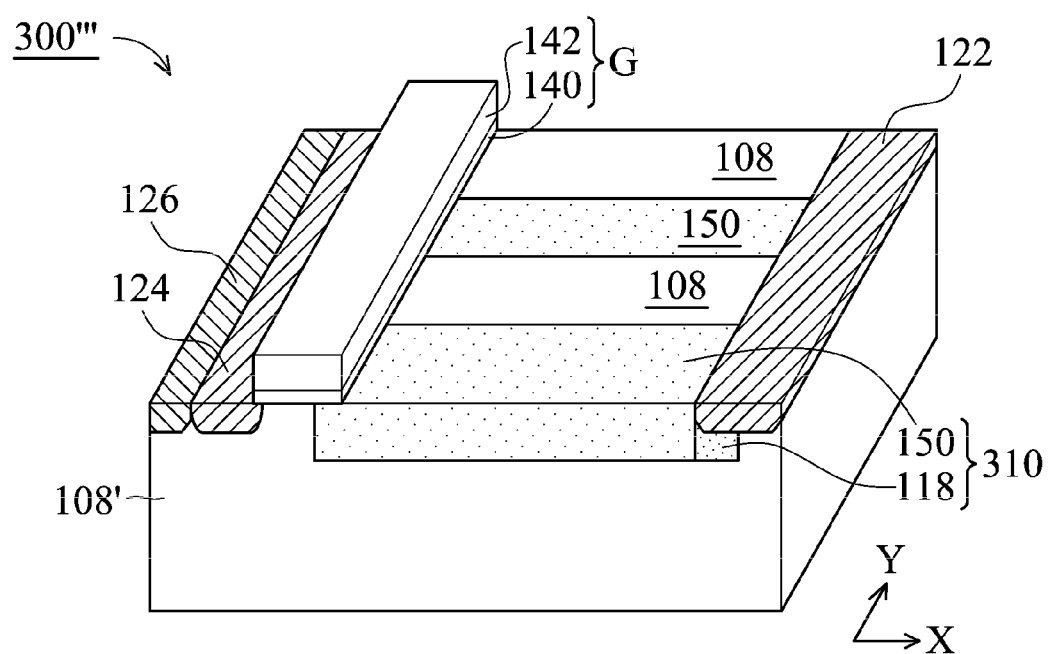
FIG. 21 is a schematic perspective view of the semiconductor device according to another embodiment of the invention.

Referring to FIGS. 20-21, schematic diagrams showing other exemplary semiconductor devices are illustrated. FIGS. 20-21 respectively illustrate semiconductor devices 300" and 300''' which are obtained by modifying the semiconductor devices 300 and 300' shown in FIGS. 13 and 19. As shown in FIGS. 20 and 21, the semiconductor devices 300" and 300''' are formed over a bulk semiconductor substrate, and the bulk semiconductor substrate is provided as a semiconductor layer 108', but not the SOI substrate 102 shown in FIGS. 13 and 19. The other components shown in FIGS. 20 and 21 are the same as that shown in FIGS. 13 and 19, and can be formed by the methods shown in FIGS. 3-13 and 14-19, but are not described again here. In these exemplary semiconductor devices, the doped region 118, the insulating layer 120 and the doped material layer 150 are merely formed in a portion of the semiconductor layer 108', and a portion of the semiconductor layer 108' surrounding the doped regions 124 and 126 may function as a well region having the first conductivity type. The semiconductor devices 300" and 300''' shown in FIGS. 20-21 may have the same performance as the semiconductor devices 300 and 300' shown in FIGS. 13 and 19.

Figure 28:
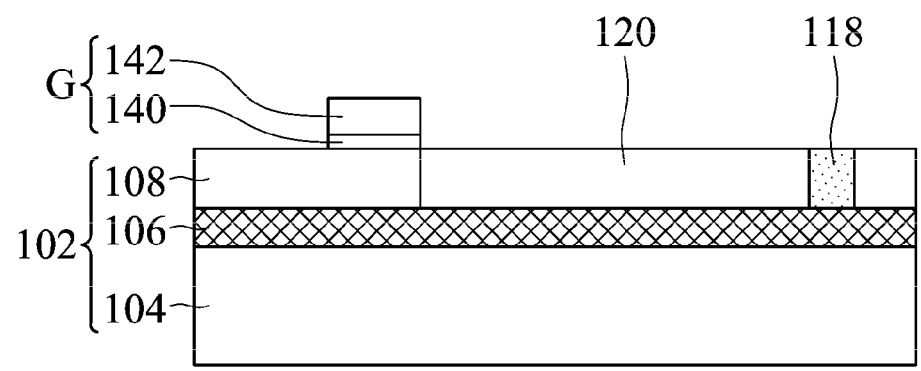
FIG. 28 is a schematic cross-sectional view showing a cross section along the line 28-28 in FIG. 27.
Figure 29:
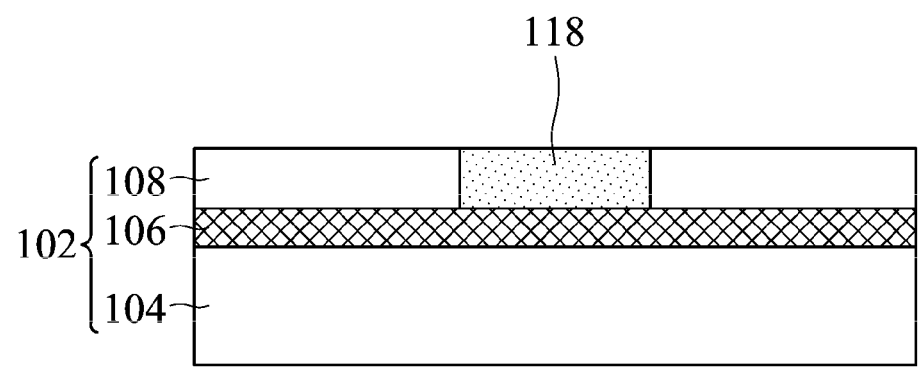
FIG. 29 is a schematic cross-sectional view showing a cross section along the line 29-29 in FIG. 27.
Figure 30:
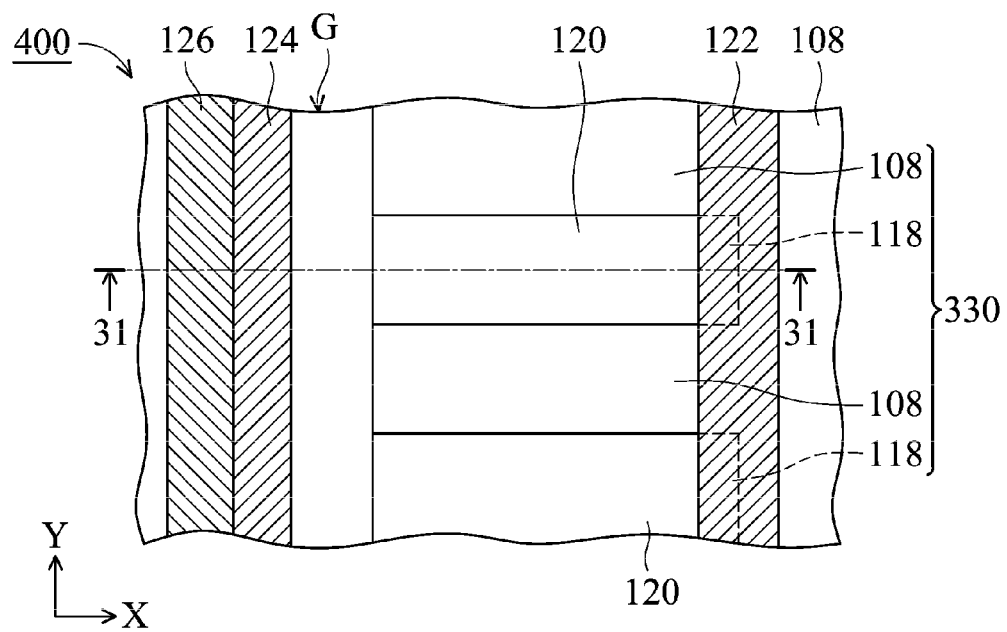
Figure 31:
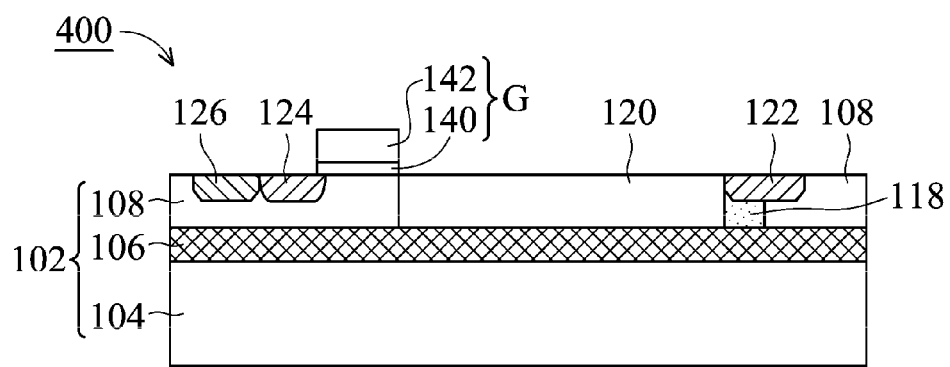
FIG. 31 is a schematic cross-sectional view showing a cross section along the line 31-31 in FIG. 30.
Figure 32:
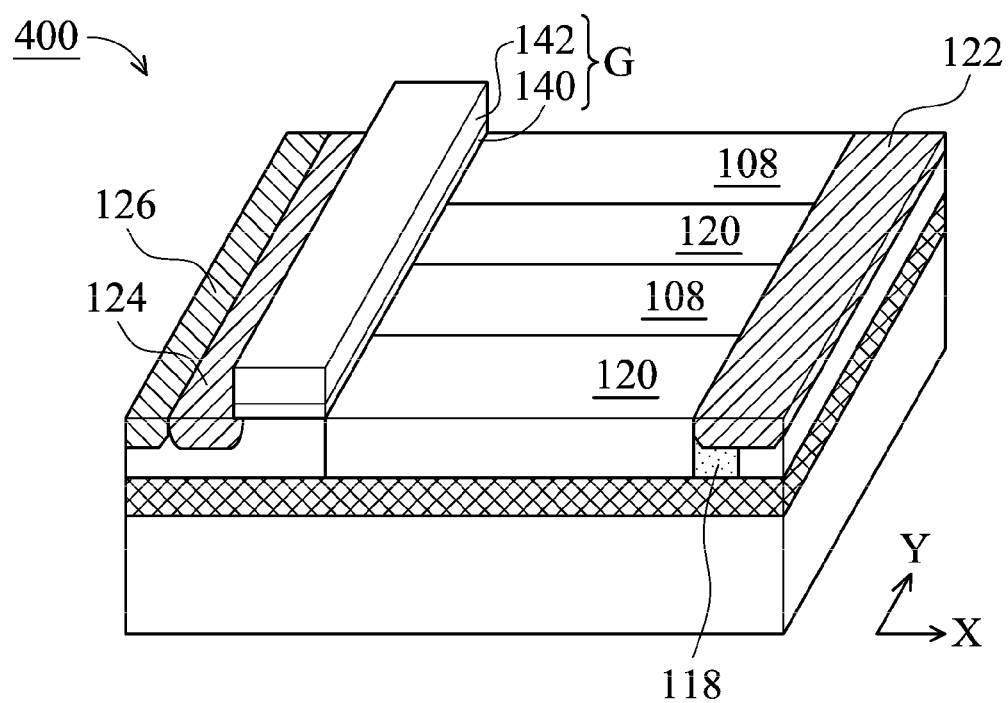
FIG. 32 is a schematic perspective view of the semiconductor device shown in FIGS. 30-31.

FIGS. 22-32 are schematic diagrams showing another exemplary method for fabricating a semiconductor device, wherein FIGS. 22, 24, 27 and 30 are schematic top views, and FIGS. 23, 25-26, 28-29 and 31 are schematic cross-sectional views along predetermined lines in FIGS. 22, 24, 27 and 30, respectively, and FIG. 32 is a schematic perspective view of the structure shown in FIGS. 30-31, thereby showing fabrications in intermediate steps in the method for fabricating the semiconductor device. Herein, the exemplary method shown in FIGS. 22-32 is modified from the exemplary method shown in FIGS. 3-13 and is different from the method shown in FIGS. 3-13. In the method for fabricating a semiconductor device shown in FIGS. 22-32, the insulating layer 120 and the doped region 180 are fabricated after formation of the gate structure G. However, for the purpose of simplicity, the same numeral references in FIGS. 22-32 represent the same components in FIGS. 3-13, and only differences between these two exemplary methods are described in the following.

Figure 22:
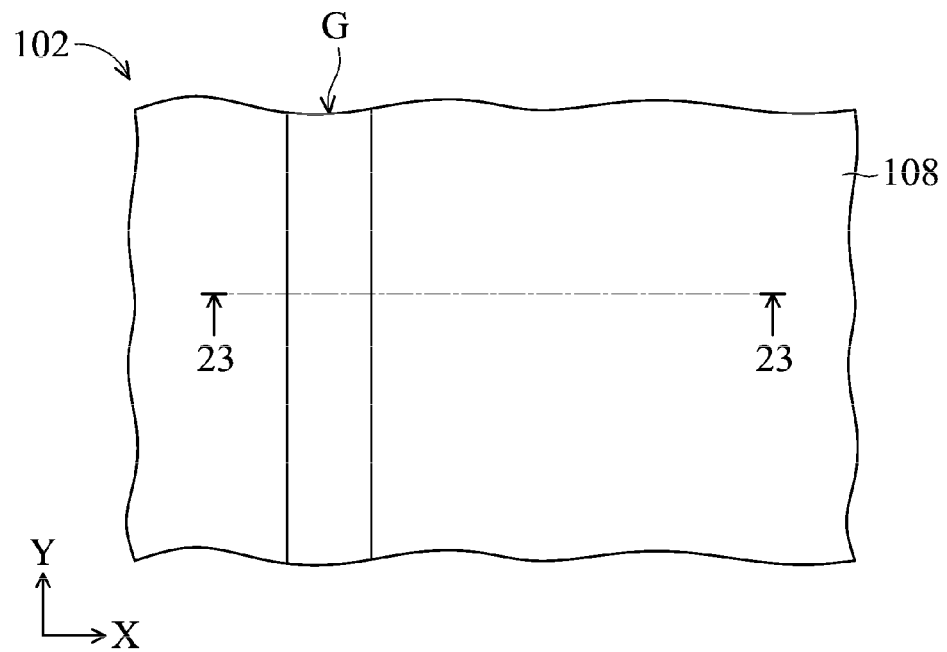
FIGS. 22, 24, 27, and 30 are schematic top views showing a method for fabricating a semiconductor device according to yet another embodiment of the invention.
Figure 23:
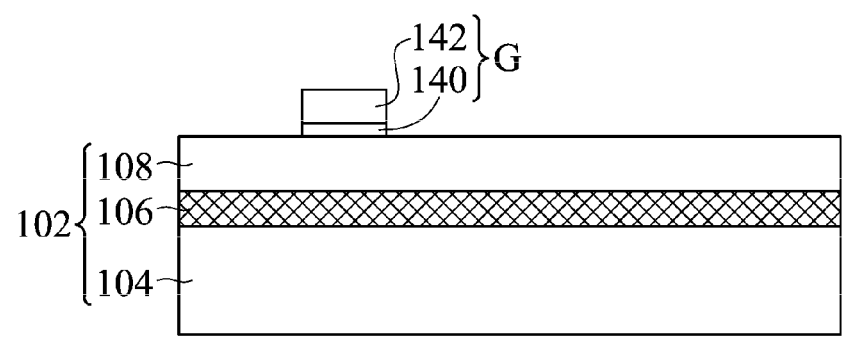
FIG. 23 is a schematic cross-sectional view showing a cross section along the line 23-23 in FIG. 22.

Referring to FIGS. 22-23, a semiconductor substrate 102 is first provided, and a gate structure G is then formed over the semiconductor substrate 102. FIG. 22 shows a schematic top view of the semiconductor substrate 102, and FIG. 23 shows a schematic cross-sectional view along lone 23-23 in FIG. 22.

As shown in FIG. 22, the semiconductor substrate 102 is, for example, a semiconductor-on-insulator (SOI) substrate. The semiconductor substrate 102 comprises a bulk semiconductor layer 104, and a buried insulating layer 106 and a semiconductor layer 108 sequentially over the bulk semiconductor layer 104. The bulk semiconductor layer 104 and the semiconductor layer 108 may comprise semiconductor materials such as silicon. The buried insulating layer 106 may comprise insulating materials such as silicon dioxide. The semiconductor layer 108 may comprise dopants of a first conductivity type such as P-type or N-type. The gate structure G extends over a portion of the semiconductor device 108 along the Y direction perpendicular to the X direction in FIG. 22. In addition, as shown in FIG. 23, the gate structure G comprises a gate dielectric layer 140 and a gate electrode layer 142 sequentially formed over the semiconductor layer 108. Herein, fabrication of the gate dielectric layer 140 and the gate electrode layer 142 of the gate structure G shown in FIGS. 22-23 can be formed by conventional high voltage MOS processes, and the gate dielectric layer 140 and the gate electrode layer 142 may comprise materials used in conventional HV MOSFETs, and the materials and fabrications thereof are not described here.

Figure 24:
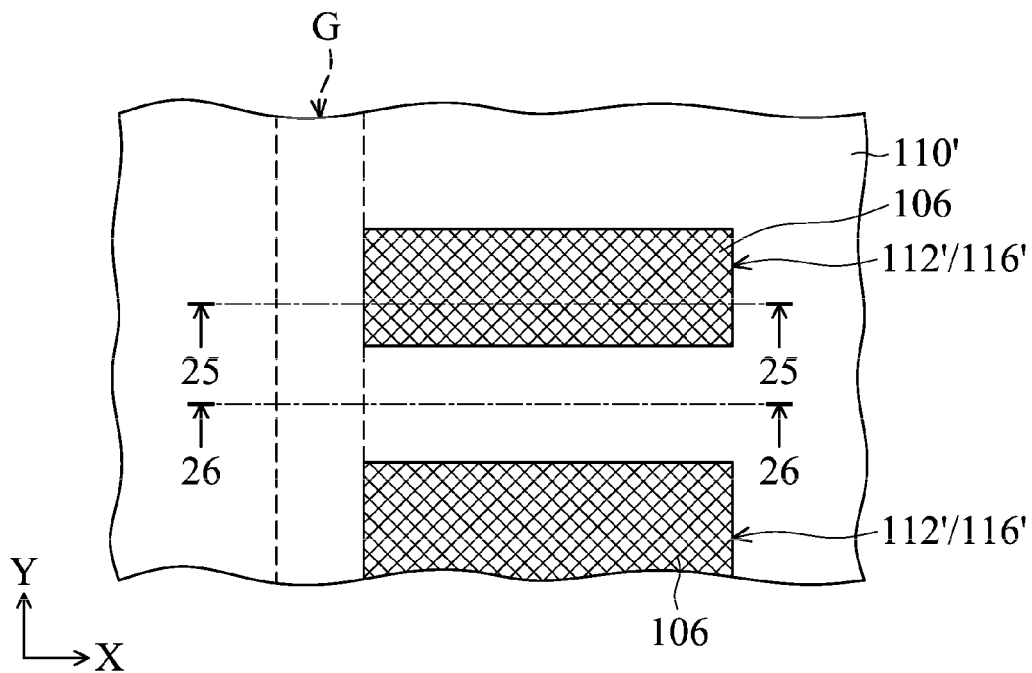
Figure 25:
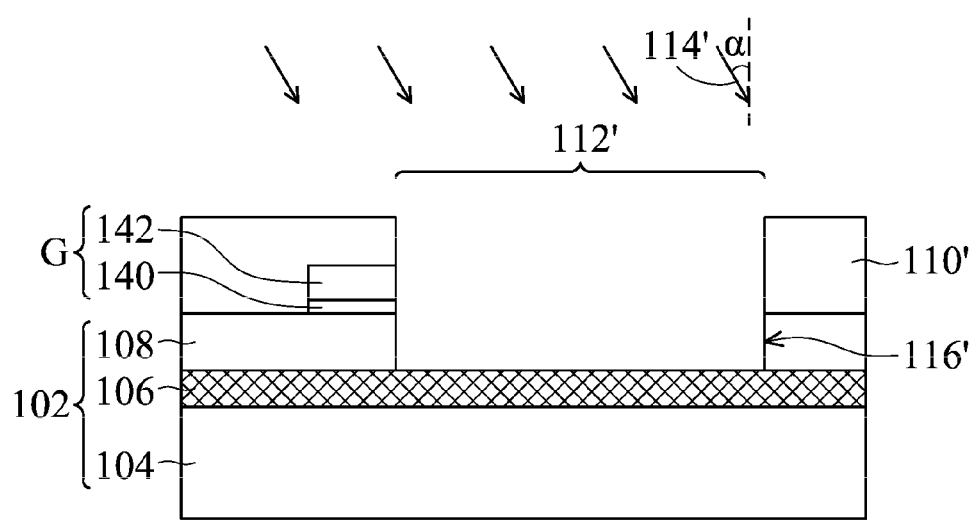
FIG. 25 is a schematic cross-sectional view showing a cross section along the line 25-25 in FIG. 24.
Figure 26:
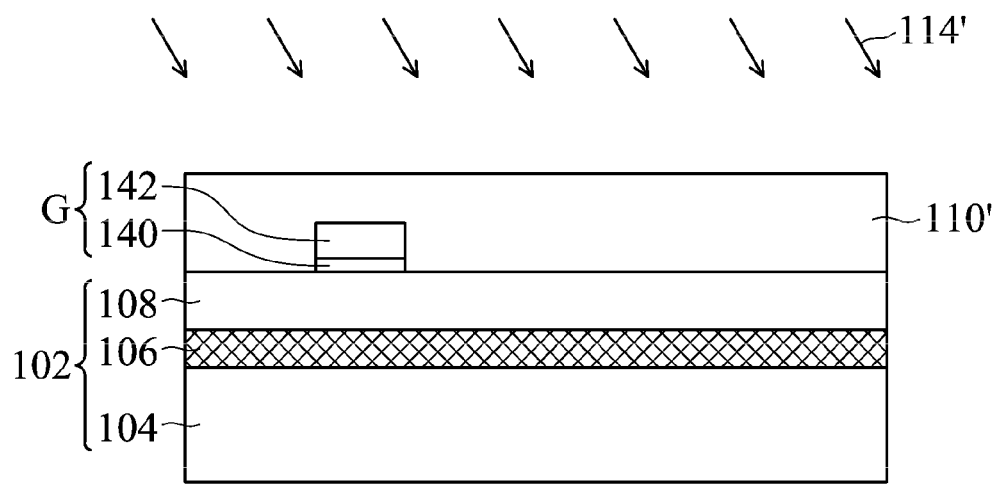
FIG. 26 is a schematic cross-sectional view showing a cross section along the line 26-26 in FIG. 24.

Referring to FIGS. 24-26, a plurality of parallel and separated openings 112'/116' are next formed in the semiconductor layer 108. These openings 112'/116' respectively expose a portion of the buried insulating layer 106 adjacent to the gate structure G. FIG. 24 shows a schematic top view of the semiconductor substrate 102 having the openings 112'/116', and FIGS. 25-26 are schematic cross-sectional views along the lines 25-25 and 26-26 in FIG. 24, respectively.

As shown in FIG. 24-25, a patterned mask layer 110' is formed over the semiconductor layer 108 and gate structure G, and the patterned mask layer 110' is formed with a plurality of parallel and separated openings 112' therein. The openings 112' extend along the X direction in FIG. 24 and respectively expose a portion of the semiconductor layer 108 adjacent to the gate structure G. The patterned mask layer 110' may comprise materials such as photoresist, such that the openings 112' can be formed in the patterned mask layer 110' by processes such as photolithography and etching (not shown) incorporating a suitable photomask (not shown). Next, an etching process (not shown) is performed to remove the portion of the semiconductor layer 108 exposed by each of the openings 112', using the patterned mask layer 110' as an etching mask, thereby transferring the pattern of the openings 112' into the semiconductor layer 108 and forming a plurality of openings 116' having a pattern the same as that of the openings 112'. Each of the openings 116' exposes a portion of the underlying buried insulating layer 106.

Next, an ion implantation process 114' is performed, using the patterned mask layer 110' as an implant mask, to implant dopants (not shown) having a second conductivity type opposite to the first conductivity type of the semiconductor layer 108 into a portion of the semiconductor layer 108 covered by the patterned mask layer 110' adjacent to a side (e.g. the right side) of each of the openings 116' along the X direction. In one embodiment, the ion implantation process 114' can be, for example, a tilt-angle implantation process using an incident angle α and an implant energy (not shown). The incident angle and the implant energy used in the ion implantation process 114' can be adjusted according to the thickness of the semiconductor layer 108 to thereby implant dopants with a desired concentration into the semiconductor layer 108. In addition, as shown in FIG. 26, a portion of the semiconductor layer 108 adjacent to the adjacent openings 116' is protected by the patterned mask layer 110' and is not implanted by the dopants having the second conductivity type in the ion implantation process 114', thereby still having the first conductivity type.

Figure 27:
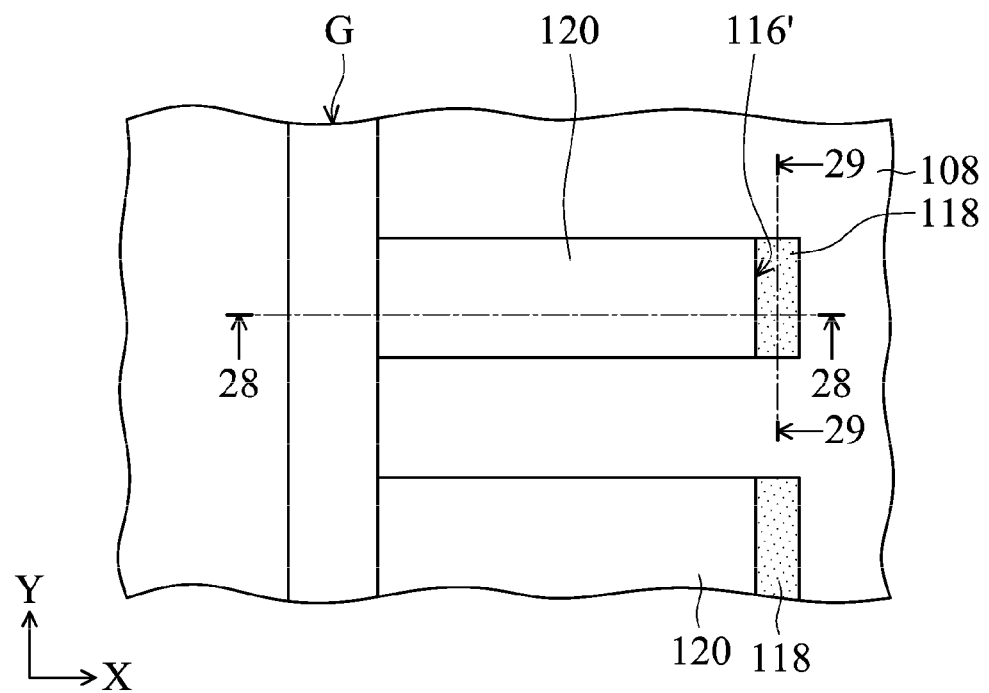

Referring to FIGS. 27-29, a doped region 118 is next formed in a portion of the semiconductor layer 108 adjacent to each of the openings 116' (illustrated as a portion at the right side of each of the openings 116), and an insulating layer 120 is then formed in each of the openings 116'. FIG. 27 is a schematic top view showing the semiconductor layer 108 having a plurality of doped regions 118 and the insulating layers 120 therein, and FIGS. 28-29 are schematic cross-sectional views along lines 28-28 and 29-29 in FIG. 27, respectively.

As shown in FIGS. 27-28, after removal of the patterned mask layer 110' formed over the semiconductor layer 108 shown in FIGS. 24-26, a thermal diffusion process (not shown) such as an annealing process is then performed to diffuse the dopants previously implanted in the portion of the semiconductor layer 108 covered by the patterned mask layer 110' and being adjacent to a side (e.g. the right side) of each of the openings 116' along the X direction in FIG. 24 into a doped region 118, and the doped region 118 has the second conductivity type opposite to the first conductivity type of the semiconductor layer 108. As shown in FIG. 27, the doped region 118 is substantially formed in a portion of the semiconductor layer 108 adjacent to a side (e.g. the right side) of each of the openings 116' and has a substantially rectangular configuration from the top view. Next, an insulating material (not shown) such as oxide or nitride is formed over the semiconductor layer 108 by a process such as deposition or spin-coating (not shown) and fills the openings 116'. A planarization process (not shown) such as a chemical mechanical polishing (CMP) process or an etching back process is next performed to remove the insulating material over the surface of the semiconductor layer 108, thereby forming an insulating layer 120 in each of the openings 116'. In one embodiment, a top surface of the insulating layer 120 and a top surface of the semiconductor layer 108 are substantially coplanar. Moreover, as shown in FIG. 29, a cross-sectional view of the doped region 118 disposed in a portion of the semiconductor layer 108 adjacent to a side (e.g. the right side) of the opening 116' is illustrated.

Referring to FIGS. 30-33, doped regions 124 and 126 are next formed in a portion of the semiconductor layer 108 at a side of the gate structure G, and a doped region 122 is formed in a portion of the semiconductor layer 108 at another side of the gate structure G. FIG. 30 is a schematic top view, and FIGS. 31-32 are schematic cross-sectional views along lines 31-31 and 32-32 in FIG. 30, respectively.

As shown in FIG. 30, the doped regions 122, 124, and 126 are formed over or in the semiconductor layer 108 along the Y direction perpendicular to the X direction in FIG. 30. The doped regions 124 and 126 are formed in a portion of the semiconductor layer 108 at a side (e.g. the left side) adjacent to the gate structure G, and the doped region 122 is formed in a portion of the semiconductor layer 108 at another side (e.g. the right side) of the gate structure G, and is also disposed over a portion of the doped region 118, as shown in FIG. 31.

Herein, fabrication of the doped regions 122, 124, and 126 shown in FIGS. 30-31 can be formed by conventional high-voltage MOS processes, and the doped regions 122 and 124 comprising dopants having the second conductivity type opposite to the first conductivity type of the semiconductor layer 108 may function as source/drain regions, and the doped region 126 may comprise dopants of the first conductivity type of the semiconductor layer 108. The portion of the semiconductor layer 108 covering the doped regions 124 and 126 may function as a well region of the first conductivity type. FIG. 32 is a schematic perspective view of the semiconductor device shown in FIGS. 30-31.

Therefore, fabrication of a semiconductor device 400 is substantially completed, and the semiconductor device 400 is a MOS transistor comprising a super-junction structure 330. The super junction structure 330 is composed of a plurality of separated doped regions 118 having a substantially rectangular configuration and a portion of the semiconductor layer 108 adjacent thereto. The doped regions 118 having the second conductivity type may function as a drift-region of the semiconductor device 400, such that the semiconductor device 400 can sustain a high breakdown voltage.

In one embodiment, as the semiconductor layer 108 of the semiconductor device 400 shown in FIGS. 30-32 has the first conductivity type such as P-type, and dopants in the doped regions having the second conductivity type are N-type dopants, such that the semiconductor device 400 formed is a PMOS transistor. Alternatively, in another embodiment, as the semiconductor layer 108 of the semiconductor device 400 shown in FIGS. 30-32 have the first conductivity type such as N-type, and dopants in the doped regions having the second conductivity type are P-type dopants, the formed semiconductor device 400 is a NMOS transistor.

When compared with the semiconductor device 10 shown in FIGS. 1-2, thicknesses of the semiconductor layer 108 and the doped regions 118 formed therein can be further increased or reduced in the semiconductor device 400 shown in FIGS. 30-32 depending on designs such as driving currents, on-resistances and breakdown voltages. Therefore, due to the formation of the semiconductor layer 108 and the doped regions 118 therein, without increasing the surface area of the separated doped regions 118 in the super-junction structures 330 of the semiconductor device 400, thicknesses of the semiconductor layer 108 and the doping regions 118 are increased to increase the sum of the cross section of the doped regions 118 in the semiconductor layer 108, thereby increasing driving currents and reducing on-resistance of the semiconductor device 400. In addition, a deep trench isolation (not shown) may be formed in the semiconductor layer (e.g. the semiconductor layer 108) of the semiconductor device 400 to surround thereof. The deep trench isolation penetrates a portion of the semiconductor layer 108, and is made of insulating materials such as silicon dioxide that contacts the buried insulating layer 106. Due to the formation of the deep trench isolation, noises affecting the semiconductor device 400 can be reduced and a latch-up effect in the semiconductor device 400 is thus prevented.

In another embodiment, the insulating layer 120 is not first formed in the method shown in FIGS. 22-32 but each of the openings 116' are filled with dielectric materials for an inter-layer dielectric layer covering the gate structure G and the semiconductor layer 108. The portion of dielectric material filled in the openings 116' may thus function as the insulating layer 120.

Figure 33:
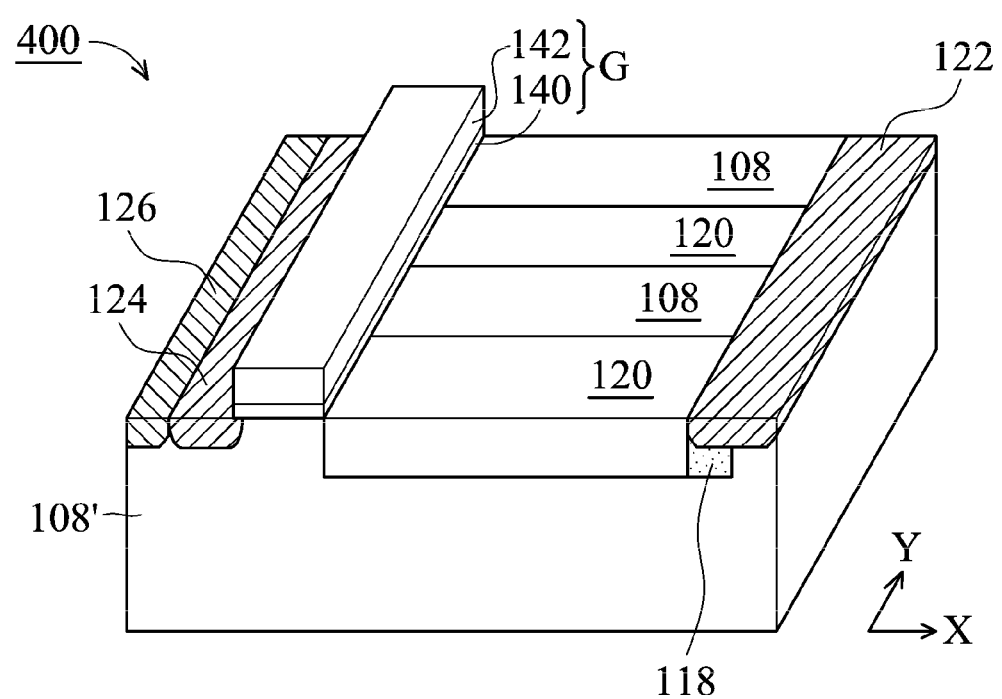
FIG. 33 is a schematic perspective view of the semiconductor device according to another embodiment of the invention.

Referring to FIG. 33, a schematic perspective view showing another exemplary semiconductor device 400' is illustrated. The semiconductor device 400' is obtained by modifying the semiconductor device 400 shown in FIG. 32. As shown in FIG. 33, the semiconductor device 400' is formed over a bulk semiconductor substrate, and the bulk semiconductor substrate is provided as a semiconductor layer 108', but not the SOI substrate 102 shown in FIG. 32. The other components shown in FIG. 33 are the same as those shown in FIG. 32, and can be formed by the methods shown in FIGS. 22-33, but not described again here. In these exemplary semiconductor devices, the doped region 118, the insulating layer 120 and the doped material layer 150 are merely formed in a portion of the semiconductor layer 108', and a portion of the semiconductor layer 108' surrounding the doped regions 124 and 126 may function as a well region having the first conductivity type. The semiconductor device 400' shown in FIG. 33 may have the same performances as the semiconductor device 400 shown in FIG. 32.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor layer having a first conductivity type;
   a plurality of first doped regions separately and in parallel disposed in the semiconductor layer along a first direction, wherein the first doped regions have a second conductivity type opposite to the first conductivity type and a rectangular top view;
   a gate structure disposed over the semiconductor layer along a second direction, wherein the gate structure covers a portion of the first doped regions;
   a second doped region, disposed in the semiconductor layer along the second direction and being adjacent to a first side of the gate structure, wherein the second doped region has the second conductivity type; and
   a third doped region, formed in the semiconductor layer along the second direction and being adjacent to a second side of the gate structure opposing the first side, wherein the third doped region has the second conductivity type, and the third doped region overlaps a top surface of the plurality of first doped regions, wherein a portion of the semiconductor layer contacts the first doped region along the first direction, and the third doped region overlaps the portion of the semiconductor layer.

2. The semiconductor device as claimed in claim 1, further comprising:
   a bulk semiconductor layer; and
   a buried insulating layer disposed over the bulk semiconductor layer, wherein the semiconductor layer is disposed over the buried insulating layer.

3. The semiconductor device as claimed in claim 1, wherein the first conductivity type is P-type and the second conductivity type is N-type.

4. The semiconductor device as claimed in claim 1, wherein the first conductivity type is N-type and the second conductivity type is P-type.

5. The semiconductor device as claimed in claim 1, further comprising an insulating layer disposed in a plurality of portions of the semiconductor layer and is adjacent to one of the first doped regions.

6. The semiconductor device as claimed in claim 1, further comprising a doped material layer disposed in a plurality of portions of the semiconductor layer and is adjacent to one of the first doped regions.

7. The semiconductor device as claimed in claim 6, wherein the doped material layer has the second conductivity type.

8. The semiconductor device as claimed in claim 1, wherein the first direction is perpendicular to the second direction.

9. The semiconductor device as claimed in claim 1, wherein the first doped regions and another portion of the semiconductor layer adjacent thereto form a super-junction structure.

10. A method for fabricating a semiconductor device, comprising the steps:
    a. providing a semiconductor layer, having a first conductivity type;
    b. forming an opening in a plurality of parallel and separated portions of the semiconductor layer;
    c. forming a first doped region in a portion of the semiconductor layer adjacent to a side of the opening;
    d. forming an insulating layer or a doped material layer in the opening, wherein the doped material layer has a second conductivity type opposite to the first conductivity type;
    e: forming a gate structure over a portion of the semiconductor layer, wherein the gate structure extends over the semiconductor layer along a second direction perpendicular to the first direction; and
    f. forming a second doped region in a portion of the semiconductor layer at a first side of the gate structure, and a third doped region in a portion of the semiconductor layer at a second side opposite to the first side of the gate structure, wherein the second doped region and the third doped region have the second conductivity type, and the third doped region overlaps a top surface of the first doped region.

11. The method as claimed in claim 10, wherein the semiconductor layer is a portion of a bulk semiconductor substrate.

12. The method as claimed in claim 10, wherein the semiconductor layer is a portion of a semiconductor-on-insulator (SOI) substrate, and the SOI substrate further comprises a bulk semiconductor layer and a buried insulating layer disposed over the bulk semiconductor layer, and the semiconductor layer is disposed over the buried insulating layer.

13. The method as claimed in claim 10, wherein the first conductivity type is P-type and the second conductivity type is N-type.

14. The method as claimed in claim 10, wherein the first conductivity type is N-type and the second conductivity type is P-type.

15. The method as claimed in claim 10, wherein the first doped region and a portion of the semiconductor layer adjacent thereto form a super junction structure.

16. The method as claimed in claim 10, wherein step (e) and step (f) are performed sequentially.

17. The method as claimed in claim 10, wherein the step (e) is performed prior to the step (b), and the step (f) is performed later than the step (d).

18. The method as claimed in claim 10, where the step (d) is performed after the step (f), and the insulating layer is simultaneously formed during formation of an interlayer dielectric layer covering the gate structure and the second and third doped regions.

19. The method as claimed in claim 10, wherein the first doped region has a substantially rectangular configuration from a top view.

20. The method as claimed in claim 10, wherein the first doped region is formed by a tilt-angle ion implantation process.

* * * * *